(12) United States Patent
Auth et al.

(10) Patent No.: US 8,318,593 B2
(45) Date of Patent: Nov. 27, 2012

(54) METHOD FOR ELECTRON BEAM INDUCED DEPOSITION OF CONDUCTIVE MATERIAL

(75) Inventors: Nicole Auth, Gustavsburg (DE); Petra Spies, Mainz (DE); Rainer Becker, Pfungstadt (DE); Thorsten Hofmann, Rodgau (DE); Klaus Edinger, Lorsch (DE)

(73) Assignee: Carl Zeiss SMS GmbH, Jena (DE)

( * ) Notice: Subject to any disclaimer, the term of this patent is extended or adjusted under 35 U.S.C. 154(b) by 0 days.

(21) Appl. No.: 13/058,493

(22) PCT Filed: Aug. 7, 2009

(86) PCT No.: PCT/EP2009/005758
§ 371 (c)(1),
(2), (4) Date: Apr. 6, 2011

(87) PCT Pub. No.: WO2010/017920
PCT Pub. Date: Feb. 18, 2010

(65) Prior Publication Data
US 2011/0183517 A1    Jul. 28, 2011

(30) Foreign Application Priority Data
Aug. 14, 2008    (DE) .......................... 10 2008 037 944

(51) Int. Cl.
*H01L 21/44* (2006.01)

(52) U.S. Cl. ................. 438/597; 438/667; 257/E21.299; 257/E21.585; 250/492.3

(58) Field of Classification Search .................. 438/584, 438/586, 597, 598, 667; 257/E21.299, E21.585; 250/492.1, 492.2, 492.21, 492.3
See application file for complete search history.

(56) References Cited

U.S. PATENT DOCUMENTS

| | | | |
|---|---|---|---|
| 3,543,394 A | 12/1970 | Matlow | |
| 5,637,538 A | 6/1997 | Frosien et al. | |
| 2005/0087514 A1* | 4/2005 | Koops et al. | 216/58 |
| 2005/0109278 A1 | 5/2005 | Liang et al. | |
| 2007/0108404 A1* | 5/2007 | Stewart et al. | 252/79.1 |

FOREIGN PATENT DOCUMENTS

| | | |
|---|---|---|
| DE | 43 40 956 A1 | 6/1995 |
| DE | 103 38 019 A1 | 3/2005 |
| DE | 10 2006 054 695 | 5/2008 |
| EP | 0 130 398 A2 | 1/1985 |

(Continued)

OTHER PUBLICATIONS

Lau et al., "Properties and applications of cobalt-based material produced by electron-beam induced deposition," J. Vac. Sci Technol. A20(4), Jul./Aug. 2002, pp. 1295-1302.*

(Continued)

*Primary Examiner* — Khiem D Nguyen
(74) *Attorney, Agent, or Firm* — Fish & Richardson P.C.

(57) ABSTRACT

The invention relates to a method for electron beam induced deposition of electrically conductive material from a metal carbonyl with the method steps of providing at least one electron beam at a position of a substrate, storing at least one metal carbonyl at a first temperature, and heating the at least one metal carbonyl to at least one second temperature prior to the provision at the position at which the at least one electron beam impacts on the substrate.

21 Claims, 2 Drawing Sheets

FOREIGN PATENT DOCUMENTS

Figure 1:
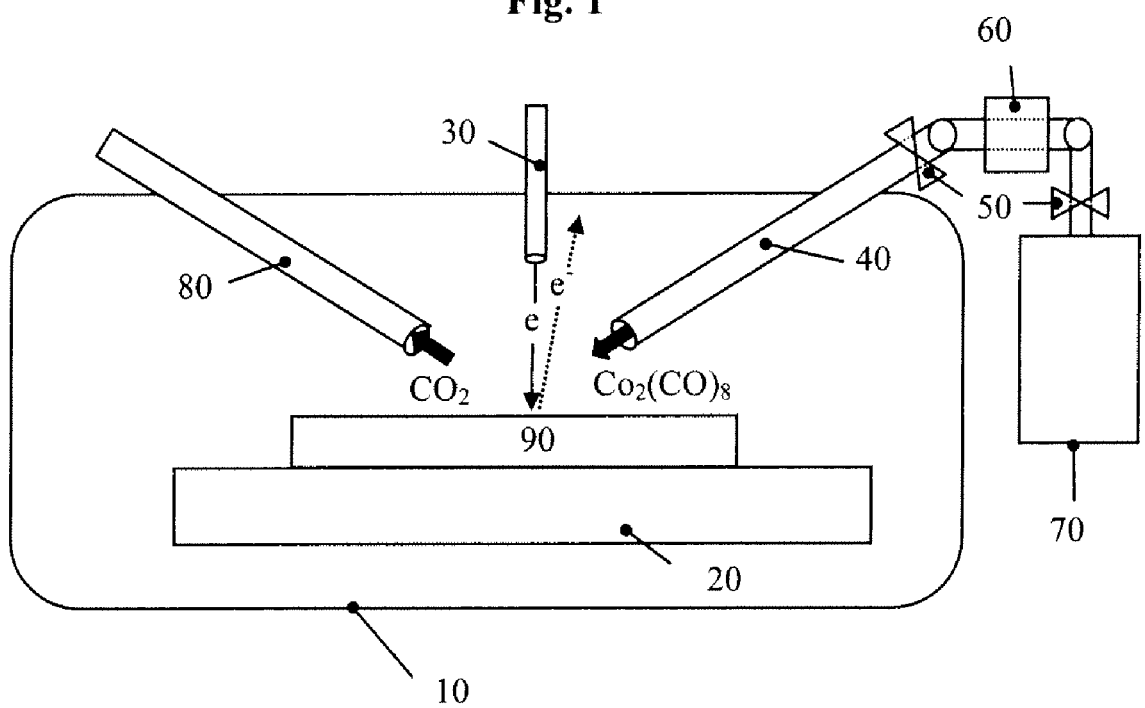

| | | |
|---|---|---|
| EP | 1 319 733 | 6/2003 |
| EP | 1 587 128 | 10/2005 |
| WO | WO 2008/059070 | 5/2008 |

OTHER PUBLICATIONS

The Safety Data Sheet, with English translation, dated May 2, 2002.

Lau et al., "Properties and applications of cobalt-based material produced by electron-beam induced deposition," J. Vac. Sci. Technol. A 20(4), Jul./Aug. 2002, pp. 1295-1302.

Utke et al., "Cross section investigations of compositions and substructures of tips obtained by focused eletron beam induced deposition," Advanced Engineering Materials Wiley-VCH Verlag GmbH Germany, vol. 7, No. 5, May 2005, pp. 323-331.

International Search Report for corresponding PCT Appl No. PCT/EP2009/005758, mailed Oct. 30, 2009.

English translation of International Preliminary Report on Patentability for corresponding PCT Appl No. PCT/EP2009/005758, (Jul. 2009).

English translation of German Office Action for corresponding German Patent Application No. 10 2008 037 944.1-45, bearing the date Oct. 21, 2009.

\* cited by examiner

METHOD FOR ELECTRON BEAM INDUCED DEPOSITION OF CONDUCTIVE MATERIAL

1. TECHNICAL FIELD

The present invention relates to a method for electron beam induced deposition of conducting material.

2. PRIOR ART

In the semiconductor technology repairing of photolithography masks and the so-called circuit editing, i.e. the directed modification of microscopic structures are important processes. For imaging of mask defects and of microelectronic circuits, a scanning tunnelling microscope is often used, since in contrast to ion beams, electron beams do not modify the scanned surface.

The removal of material on a microscopic scale with the aid of an electron beam and an appropriate etching gas is already established and has been described many times. In the DE 103 38 019 A1, applicant disclosed a method for electron beam induced etching of metal oxide layers. Furthermore, in the EP 04 008 972.4, applicant described an apparatus for investigating and modifying a sample by means of an electron beam.

It also already exists a comprehensive literature to the process of the deposition of material for the repair of photolithography masks. Also the problem of the deposition of conducting material at the circuit editing for (new) wiring of circuit paths on a microscopic scale has also already been intensively investigated. The specific electric resistance is the most important parameter for newly generated electrically conductive connections on a microscopic scale.

The EP 0 130 398 discloses for the first time the application of an electron beam for the deposition of electrically conductive connections from nickel tetracarbonyl ($Ni(CO)_4$). In agreement with the literature applicant has identified metal carbonyls and tungsten hexafluoride ($WF_6$) as precursor materials with which electrically conductive materials with a low specific electrical resistance can be deposited with an electron beam. The last mentioned precursor material does not have carbon which could incorporate in the deposit. However, applicant has found out by comprehensive investigations that $WF_6$ deposits have a coarse grained microstructure which does not allow a reliable and non-destructive current transport. In particular, when filling so called vias or access holes by means of $WF_6$ and an electron beam, the fluorine released from the reaction of the precursors etches the side walls which limit the via and thus leading to an additional integration of an unwanted component in the deposit.

When using metal carbonyls, no unknown components are incorporated in the deposit of the sample, but the composition of the deposited material contains in parallel to the metal central atom also carbon and oxygen from the CO legends of the metal carbonyl. The composition of the deposit—and thus of course also its specific electrical resistance—depends therefore from the process control of the electron beam induced deposition.

The authors Lau, Chee, Thong and Ng have deposited conducting needles of dicobalt octacarbonyl under different process conditions with the aid of an electron beam and have analyzed the fabricated samples (Y. M. Lau, P. C. Chee, J. T. L. Thong and V. Ng, *"Properties and applications of cobalt-based material produced by electron-beam induced deposition"*, J. Vac. Sci. Technol. A 20(4), 1295-1302 (2002)). In this process, it arose that low current strengths of the electron beam lead to the deposition of amorphous material which is electrically hardly conductive; wherein large current strengths cause the deposition of polycrystalline material with a large cobalt fraction (up to 50 atom-%). This interrelationship has been observed at large acceleration voltages for the electrons of the electron beam and also at large dwell times of the electron beam.

When filling vias or access holes by the deposition of conductive material, the combination of large flow rates of the metal carbonyl, large current strengths of the electron beam and the large acceleration voltages does however not result in the deposition of material with low specific electrical resistance. The impact of high-energy electrons with large current strengths on a substrate leads to the electrostatic charging of the substrate, whereby the spatial resolution of the electron beam is reduced. This comes along with a reduced control of the deposition process. Moreover, the application of high acceleration voltages is unwanted, because high acceleration voltages involve damages of sensible semiconductor devices. In addition to the parameters of the electron current, applicant has investigated the influence of the processing of the metal carbonyl on the specific electrical resistance of the deposited material.

The present invention is therefore based on the problem to indicate a more simple method for electron beam induced deposition of conducting material from a metal carbonyl which at least partly avoids the above-mentioned disadvantages and restrictions.

3. SUMMARY OF THE INVENTION

According to an embodiment of the present invention this problem is solved by a method for electron beam induced deposition of electrically conductive material which comprises providing at least one electron beam at a position of a substrate, storing the at least one metal carbonyl at a first temperature and heating at least one metal carbonyl to at least one second temperature prior to the provision at the position at which the at least one electron beam impacts.

Applicant has surprisingly found out that, in parallel to the parameters of the electron beam, the treatment of the metal carbonyl has a decisive influence on the deposition of electrically conductive material. By storing the metal carbonyl at temperatures significantly below room temperature (300 K), the spontaneous conversion of a metal carbonyl can be avoided, as for example from dicobalt octacarbonyl ($CO_2(CO)_8$) in tetracobalt dodecacarbonyl ($CO_4(CO)_{12}$) accompanied by the formation of carbon monoxide (CO). By the formation of CO in the supply tank parallel to the metal carbonyl also carbon monoxide is provided at the position of the deposition and is partly incorporated in the material to be deposited. The portion of the metallic component in the deposit is therefore reduced and its specific electrical resistance is increased. Because only the provision of the metal carbonyl at sufficiently high temperature allows the deposition of material with low specific electrical resistance, the metal carbonyl is heated prior to the introduction in the vacuum chamber. By these measures conducting deposits can reliably be manufactured.

In a preferred embodiment of the inventive method, dicobalt octacarbonyl ($Co_2(CO)_8$) is used as metal carbonyl. However, other metal carbonyls can be used having for example as the metal central atom chromium (Cr), iron (Fe), manganese (Mn), molybdenum (Mo), nickel (Ni), tellurium (Te), rhenium (Rh), ruthenium (Ru), vanadium (V), tungsten (W), etc. Furthermore, it is conceivable to use two or more metal compounds in combination at the position of the impact of the electron beam.

Preferably, the first temperature for the metal carbonyl comprises a range of 230 K to 320 K, preferably of 240 K to 290 K and particularly preferred of 250 K to 260 K. The ideal temperature depends on the material and the basic conditions defined by the gas supply system.

In a preferred embodiment of the inventive method the second temperature for the metal carbonyl comprises a range of 265 K to 320 K, preferably of 270 K to 300 K and particularly preferred of 275 K to 280 K.

In a particularly preferred embodiment of the inventive method the electron beam and the metal carbonyl are used for filling a via.

Primarily the electron beam has at the beginning of the filling a refresh time of 20 milliseconds to 0.2 milliseconds, preferably of 5 milliseconds to 0.8 milliseconds and particularly preferred of 2.5 milliseconds to 1.6 milliseconds. In a preferred embodiment, the electron beam has at the end of the filling a lower refresh time, preferably a factor of ten lower refresh time compared to the beginning of the filling.

In a preferred embodiment of the inventive method the electron beam has at the beginning of the filling a dwell time of 2000 nanoseconds to 10 nanoseconds, preferably of 500 nanoseconds to 40 nanoseconds and particularly preferred of 250 nanoseconds to 160 nanoseconds. In a favorable embodiment the electron beam has at the end of the filling a lower dwell time, preferably a factor of two lower dwell time compared to the beginning of the filling.

In a particularly preferred embodiment of the inventive method, the quotient of the refresh time and the dwell time is increased when filling a via with increasing aspect ratio.

In a further particularly preferred embodiment of the inventive method, the deposited conducting material has a specific electrical resistance of less than 100 $\mu\Omega\cdot$cm.

Preferably, a supply system for the metal carbonyl is adapted for exhausting the emerging carbon dioxide from a vacuum chamber. Primarily, the vacuum chamber does not have additional heating sources in addition to the electron beam.

In a preferred embodiment of the inventive method, the electron beam is used for locating the position to be processed and/or to control the deposition of the electrically conductive material and/or its environment.

According to a further aspect of the present invention, an apparatus for electron beam induced the deposition of electrically conductive material has an electron beam device for providing at least one electron beam at a position of a surface, a storage tank for storage at least one metal carbonyl at a first temperature and a device for heating the at least one metal carbonyl to at least one second temperature prior to the provision at a position at which the at least one electron beam impacts.

Further embodiments of the inventive method are defined in further dependent patent claims.

4. DESCRIPTION OF THE DRAWINGS

Figure 2:
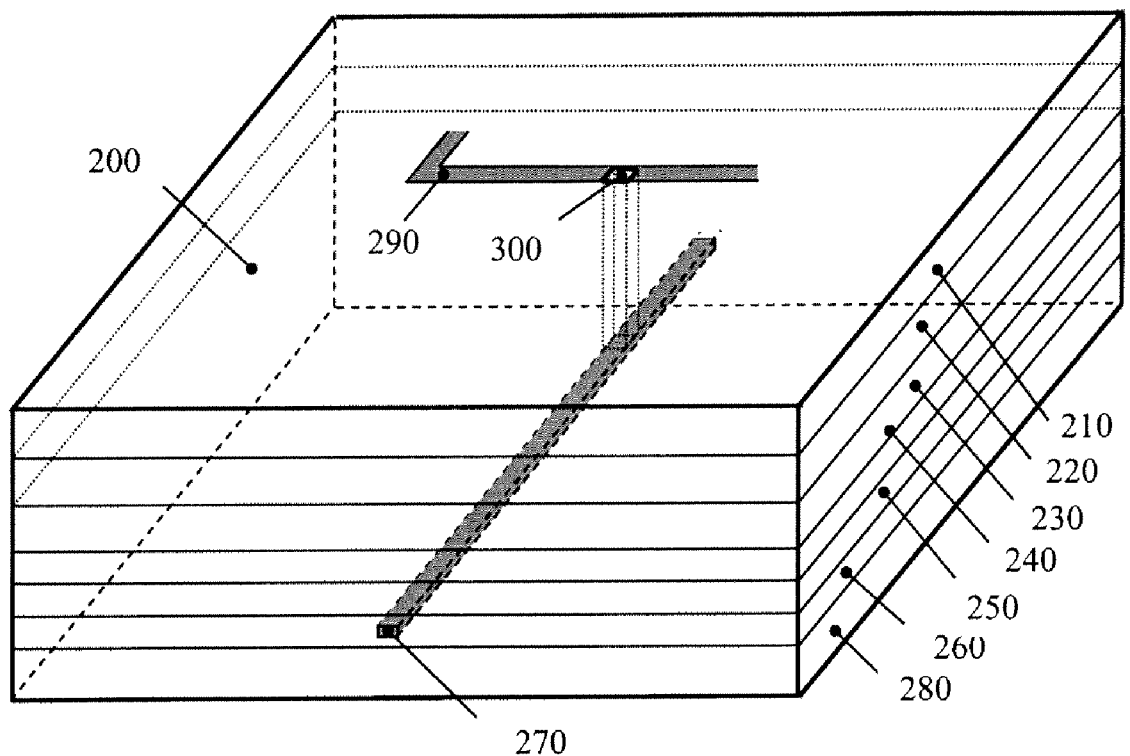
Figure 3:
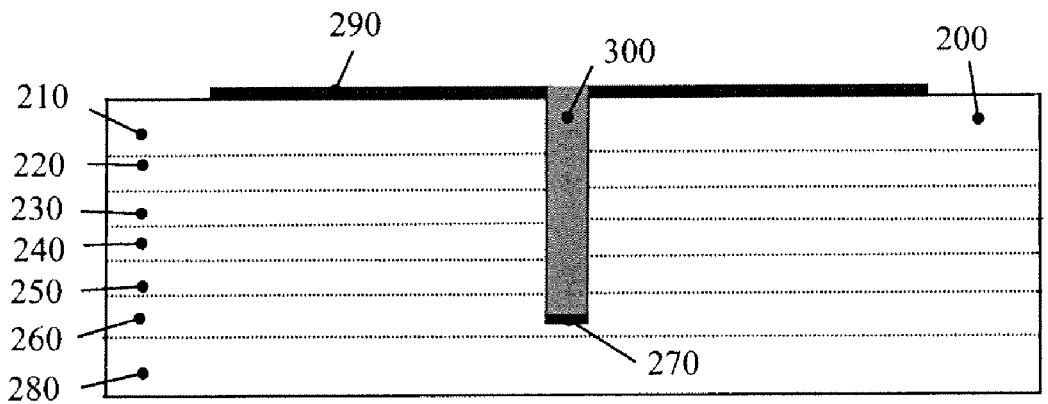

In the following detailed description presently preferred embodiments of the invention are described with reference to the drawings, wherein FIG. 1 shows a schematic representation of an exemplary apparatus for the realization of the method, wherein electrically conductive material can be deposited on a substrate in a vacuum chamber by the combined impact of a metal carbonyl and a focused electron beam;

FIG. 2 shows a schematic enlarged representation of a via etched from a first wiring level through several layers of a multilayer system to a second wiring level; and FIG. 3 shows a schematic cross section through the via of FIG. 2 which has been filled with electrically conductive material according to an embodiment of the inventive method.

5. DETAILED DESCRIPTION OF PREFERRED EMBODIMENTS

In the following, preferred embodiments of the inventive method and the inventive apparatus are explained in detail.

FIG. 1 schematically depicts that a substrate 90 is arranged on a substrate holder 20 in a vacuum chamber 10 on which conducting material is to be deposited. In the FIGS. 2 and 3, the substrate 90 comprises a multi-layered system 200. The electron beam for the realization of the inventive method originates from the electron beam device 30 which is for example as the case may be a modified scanning tunnelling microscope.

In the preferred embodiment of the present invention schematically represented in FIG. 1, dicobalt octacarbonyl ($Co_2(CO)_8$) is used as metal carbonyl. Alternative embodiments of the inventive method allow the application of metal carbonyls with different metal central atoms, as for example Cr, Fe, Ni, Mo, V and W to just mention some examples. It is further conceivable to introduce two or multiple metal carbonyls each over its own valve through a single or through separate inlets in the vacuum chamber 10 (not shown in FIG. 1). Alternatively, to the supply system 40 for the metal carbonyl which is directed to the electron beam, the first and/or the multiple metal carbonyls can also be introduced undirected in the vacuum chamber 10.

The metal carbonyl $CO_2(CO)_8$ is stored in a storage tank 70. The storage tank has a cooling device and a temperature control. For this reason, the content of the storage tank 70 can be stored at a defined temperature. In particular, the storage tank 70 allows the storage of dicobalt octacarbonyl below room temperature. It has proven to be beneficial to store $CO_2(CO)_8$ essentially at 253 K. At this temperature a spontaneous conversion of dicobalt octacarbonyl in tetrakobalt dodecacarbonyl accompanied by the formation of CO can be avoided or sufficiently slowed down, respectively.

If CO is formed in the storage tank 70 to a significant extend, the carbon monoxide is provided together with $CO_2(CO)_8$ in the vacuum chamber at the position of the deposition. In doing so, the $CO_2(CO)_8$ gas flow rate effectively available in the vacuum chamber is smaller than the experimentally determined gas flow rate through the supply system 40. The additional CO is at least partially incorporated in the deposited material. By the increased incorporation of carbon and oxygen in the deposited material, the portion of the metallic compound is reduced. This results in a larger specific electrical resistance of the deposit.

The device 60 can heat the $CO_2(CO)_8$ coming from the supply tank 70 to an adjustable temperature. This is necessary since only the provision of the metal carbonyl at the position of the impact of the electron beam on the substrate 90 at a sufficiently high temperature results in the deposition of electrically conductive material with low specific electrical resistance. It has been found out that the supply of the dicobalt octacarbonyl via the inlet 40 at a temperature of approximately 278 K leads to the deposition of conducting material with low specific electrical resistance. The apparatus 60 also allows to modify the temperature of $CO_2(CO)_8$ during the deposition process. Since the inlet temperature for dicobalt octacarbonyl is below room temperature, the energy necessary for heating the metal carbonyl from the storage temperature to the inlet temperature can in an alternative embodiment be taken from the environment. The device 60 can be operable to allow the heating of the metal carbonyl via this path. It is also conceivable that the device 60 combines both described possibilities of heating in one embodiment.

The valve 50 in the supply system 40 enables the provision of a defined gas flow rate at the position the electron beam impacts on the substrate 90 or the controlled introduction of $CO_2(CO)_8$ from the storage tank 70 in the heating device 60. In the preferred embodiment represented in FIG. 1, the metal carbonyl is continuously provided at the position of the electron beam impacts on the substrate 90. In an alternative embodiment, the valves 50 allow temporally varying the gas flow rate in the supply system 40. An important part of the supply system 40 is the exhaust device 80 represented in FIG. 1. The exhaust device 80 allows exhausting the carbon dioxide from the vacuum chamber 10 which emerges from the metal carbonyl essentially from the location of its generation. Thus, a contamination of the vacuum chamber is avoided, because the $CO_2$ is locally exhausted at the position of the impact of the electron beam on the substrate 90 from the vacuum chamber 10 prior it can distribute or deposit. Alternatively to the embodiment shown in FIG. 1 with two separate systems for the supply system 40 and the exhaust device 80, the supply system 40 for the metal carbonyl and the exhaust device 80 for the emerging carbon dioxide can be combined in a system, for example by two tubes or hollow needles, respectively which are arranged adjacent to each other or which are interleaved.

To initialize the etching reaction preferably exclusively a focussed electron beam is used. The acceleration voltage for the electrons of the electron beam is in the range of 0.1 keV to 30 keV. The current strength of the applied electron beam varies in an interval between 1 pA and 1 nA. However, additionally or alternatively, also other energy transferring mechanisms can be applied (for example a focused laser beam and/or an unfocused ion beam). In favourable embodiments of the inventive method, it is however not desirable to have additional heating sources within the vacuum chamber 10 at positions outside of the deposition range.

In parallel to the mask repair, the electron beam induced deposition is mainly used for wiring or rewiring of microelectronic circuit paths and to directly deposit electrically conductive connections between microelectromechanical systems (MEMS). Various embodiments of the inventive method can be applied for the mentioned different application fields. In the following, a preferred embodiment is explained in detail for the filling of deep vias with large aspect ratios to connect microelectronic circuit portions. The aspect ratio describes the ratio of the depth or height, respectively, of a structure to its smallest lateral extension.

FIG. 2 shows a multi-layered system 200 having on its surface a first wiring level represented by the electrical connection 290. The layers 210, 220, 230, 240, 250 and 280 are in the example of FIG. 2 semiconductor layers of different composition and/or doping. It is however also possible that one, multiple or all of the layers 210, 220, 230, 240, 250 and 280 represent isolator layers. A second wiring level is embedded in the isolator layer 260 having metallically conductive to connections symbolized by the electrical connection 270. In FIG. 2, a via 300 has been etched from the electrical connection 290 of the first wiring level to the electrical connection 270 of the second wiring level.

FIG. 3 represents a cross-section through the via 300 of the multi-layered system 200 of FIG. 2 after the filling of the via 300 using an embodiment of the inventive method. To produce to an electrically conductive connection with low specific electrical resistance in the via 300 between the electrical connectors 270 and 290 the refresh time of the electron beam is at the beginning of the deposition process, i.e. at the bottom of the via essentially 2 ms (milliseconds). This parameter reduces at the end of the filling process at the upper end of the via 300 by approximately one order of magnitude to essentially 0.2 milliseconds. At the beginning of the filling process in the range of the electrical connection 270, the electron beam remains essentially 200 ns (nanoseconds) at a position. At the upper end of the via at the end of the filling process, the dwell time reduces essentially 100 ns. In this embodiment the electron beam had the energy of 1 keV and the current strength was in the range between 1 pA and 50 pA. The diameter of the electron beam was essentially 4 nm. Here, as well as on other positions of the description, the term "essentially" has the meaning of a designation within the framework of exactness of the measurements.

As represented in the preceding section, the quotient of the refresh time and the dwell time changes during the filling of the contact hole 300. This quotient shows additionally a dependency of the aspect ratio of the via to be filled. With increasing aspect ratio, it is favourable to increase the quotient of the refresh time and dwell time to obtain deposits with low specific electric resistance. The inventive method allows depositing of material with low specific electric resistance of smaller than 100 µΩ·cm. This numerical value is indeed still a factor of 20 higher than the specific electrical resistance of metallic cobalt. However, the achieved numerical value of the specific electrical resistance is in the same order of magnitude as the best value of 45 µΩ·cm indicated by Lau et al. (Y. M. Lau, P. C. Chee, J. T. L. Thong and V. Ng, "*Properties and applications of cobalt-based material produced by electron-beam induced deposition*", J. Vac. Sci. Technol. A 20(4), 1295-1302 (2002)). However, the value of Lau et al. could only be obtained under especial experimental conditions, namely with large electron currents, large electron energies and large dwell times of the electron beam at a position. Under these experimental conditions it is not possible to fill a via with material whose specific resistance is in the range indicated by Lau et al.

The invention claimed is:
1. A method, comprising:
  storing dicobalt octacarbonyl at a first temperature of 240 K to 290 K;
  heating the dicobalt octacarbonyl to a second temperature greater than the first temperature; and
  after heating the dicobalt octacarbonyl to the second temperature, interacting the dicobalt octacarbonyl with an electron beam to deposit a material on a substrate,
  wherein interacting the dicobalt octacarbonyl with the electron beam comprises adjusting a refresh time of the electron beam and adjusting a dwell time of the electron beam so that the material has a specific electric resistance of less than 100 µΩ·cm, and
  wherein the electron beam has a current between 1 pA and 1 nA.

2. The method of claim 1, wherein the first temperature is 253K.

3. The method of claim 1, wherein the first temperature is a range of 250 K to 260 K.

4. The method of claim 1, wherein, interacting the dicobalt octacarbonyl with the electron beam, the electron beam has a refresh time in a range of 0.2 milliseconds to 20 milliseconds, and the electron beam has a dwell time in a range between 10 nanoseconds and 2000 nanoseconds.

5. The method of claim 1, wherein the second temperature is in a range of 265 K to 320 K.

6. The method of claim 1, wherein the second temperature is in a range of 270 K to 300 K.

7. The method of claim 1, wherein the second temperature is in a range of 275 K to 280 K.

8. The method of claim 1, comprising using the material to fill a via.

9. The method of claim 8, wherein, when first filling the via, the electron beam has a refresh time of 20 milliseconds to 0.2 milliseconds.

10. The method of claim 8, wherein:
when first filling the via, the electron beam has a first refresh time;
at the end of filling the via, the electron beam has a second refresh time; and
the second refresh time is less than the first refresh time.

11. The method of claim 8, wherein, when first filling the via, the electron beam has a dwell time of 2000 nanoseconds to 10 nanoseconds.

12. The method of claim 8, wherein:
when first filling the via, the electron beam has a first dwell time;
at the end of filling the via, the electron beam has a second dwell time; and
the second dwell time is less than the first dwell time.

13. The method of claim 8, wherein a quotient of a refresh time of the electron beam and a dwell time of the electron beam is increased with increasing aspect ratio of the via during filling the via.

14. The method of claim 1, further comprising removing carbon dioxide formed by the interaction of the electron beam and the dicobalt octacarbonyl.

15. The method of claim 1, wherein the method is performed in a vacuum chamber that has no heat sources other than the electron beam.

16. The method of claim 1, comprising using a temperature control and a cooling device to store the dicobalt octacarbonyl at the first temperature.

17. The method of claim 1, comprising heating the dicobalt octacarbonyl from the first temperature to the second temperature as the dicobalt octacarbonyl flows from a source to the electron beam.

18. A method, comprising:
storing dicobalt octacarbonyl at a first temperature of 240 K to 290 K;
heating the dicobalt octacarbonyl to a second temperature greater than the first temperature, the second temperature being from 265 K to 320 K; and
after heating the dicobalt octacarbonyl to the second temperature, interacting the dicobalt octacarbonyl with an electron beam to fill a via with a material formed by the interaction of the electron beam and the dicobalt octacarbonyl
wherein interacting the dicobalt octacarbonyl with the electron beam comprises adjusting a refresh time of the electron beam and adjusting a dwell time of the electron beam so that the material has a specific electric resistance of less than 100 $\mu\Omega \cdot cm$, and
wherein the electron beam has a current between 1 pA and 1 nA.

19. The method of claim 18, wherein the first temperature is in a range of 250 K to 260 K.

20. the method of claim 18, wherein the second temperature is in a range of 270 K to 300 K.

21. The method of claim 18, wherein the second temperature is in a range of 275 K to 280 K.

* * * * *

UNITED STATES PATENT AND TRADEMARK OFFICE
CERTIFICATE OF CORRECTION

PATENT NO. : 8,318,593 B2
APPLICATION NO. : 13/058493
DATED : November 27, 2012
INVENTOR(S) : Nicole Auth et al.

Page 1 of 1

It is certified that error appears in the above-identified patent and that said Letters Patent is hereby corrected as shown below:

Column 6,
Line 59, after "is" insert --in--

Column 8,
Line 28, delete "the" and insert --The-- (1st occurrence)

Signed and Sealed this
Nineteenth Day of March, 2013

Teresa Stanek Rea
*Acting Director of the United States Patent and Trademark Office*